United States Patent [19]

Mori

[11] 4,316,202
[45] Feb. 16, 1982

[54] SEMICONDUCTOR INTEGRATED CIRCUIT DEVICE HAVING A SCHOTTKY BARRIER DIODE

[75] Inventor: Susumu Mori, Tokyo, Japan

[73] Assignee: Nippon Electric Co., Ltd., Japan

[21] Appl. No.: 234,848

[22] Filed: Feb. 17, 1981

Related U.S. Application Data

[63] Continuation of Ser. No. 972,725, Dec. 26, 1978, abandoned.

[30] Foreign Application Priority Data

Dec. 27, 1977 [JP] Japan ............................ 52-158855

[51] Int. Cl.$^3$ ............... H01L 29/48; H01L 29/56; H01L 29/64
[52] U.S. Cl. ........................... 357/15; 357/48; 357/92; 307/304
[58] Field of Search ............. 357/15, 48, 92; 307/304

[56] References Cited

U.S. PATENT DOCUMENTS

| | | | |
|---|---|---|---|
| 3,585,412 | 6/1971 | Hodges | 357/15 |
| 3,660,822 | 5/1972 | Davidson | 357/15 |
| 3,719,797 | 3/1973 | Andrews et al. | 357/15 |
| 3,770,606 | 11/1973 | Lepselter | 357/15 |
| 3,780,320 | 12/1973 | Dorier et al. | 357/15 |
| 3,995,301 | 11/1976 | Magdo | 357/15 |
| 4,035,664 | 7/1977 | Berger et al. | 357/15 |
| 4,070,654 | 1/1978 | Tachi | 357/15 |
| 4,159,915 | 7/1979 | Anantha et al. | 357/15 |
| 4,183,036 | 1/1980 | Muller | 357/15 |
| 4,199,775 | 4/1980 | Agraz-Guerena | 357/15 |

Primary Examiner—Andrew J. James

[57] ABSTRACT

An integrated Schottky barrier diode having a low forward voltage is disclosed. It has been discovered that, contrary to previous theory, the mathematical relationships between the contact area of a Schottky barrier diode and the series resistance thereof and between the contact area and the forward current at zero forward voltage are non-linear for sufficiently small contact areas. According to the present invention, a Schottky barrier diode comprises several smaller Schottky barrier diodes connected in parallel and sharing a common cathode, the Schottky barrier contact area of each of the component diodes being sufficiently small to fall within the range in which barrier contact area is non-linearly related to at least one of series resistance and forward current at zero forward voltage. A Schottky barrier diode formed of several smaller diodes in this manner has a lower forward voltage than an SBD that has the same total barrier contact area but that is not split up into several component diodes.

10 Claims, 15 Drawing Figures

SEMICONDUCTOR INTEGRATED CIRCUIT DEVICE HAVING A SCHOTTKY BARRIER DIODE

RELATED APPLICATIONS

This is a continuation of U.S. patent application Ser. No. 972,725 filed Dec. 26, 1978 now abandoned.

BACKGROUND OF THE INVENTION

The present invention relates in general to a semiconductor integrated circuit device having a Schottky barrier diode, and more particularly, to a semiconductor integrated circuit device having a plurality of Schottky barrier diodes whose forward voltage is low.

Heretofore, a semiconductor integrated circuit device in which a plurality of Schottky barrier diodes (hereinafter abbreviated as SBD's) are formed on a surface of one conductivity region of a semiconductor substrate, and in which one part of the one conductivity region is connected to one electrode that is common to the SBD's, has been often used in a logic circuit, as is illustrated and described, for example, in IEEE JOURNAL OF SOLID-STATE CIRCUITS, Vol. SC-10, No. 5, October 1975, pp. 343-348. In such a device, when the common electrode has taken a predetermined condition, it is necessary for the plurality of SBD's to operate simultaneously. However, the forward voltage $V_F$ of an SBD provided at a location remote from the electrode becomes higher than that of an SBD near the electrode, so that the simultaneous operation of the SBD's would become impossible. In a semiconductor integrated circuit device, on an insulating film between SBD's are provided wiring layers to be connected to the other parts of the device, so that naturally the distance between the common electrode and the SBD becomes long and the forward voltage $V_F$ of the SBD becomes still greater. As one solution for this problem it may be conceived to provide a high impurity concentration region of one conductivity type in the semiconductor surface between the SBD's where an SBD is not formed, but even with such provision a satisfactory result cannot be expected.

SUMMARY OF THE INVENTION

Therefore, it is one object of the present invention to provide a semiconductor integrated circuit device having an SBD provided in one conductivity type region of a semiconductor substrate, in which the forward voltage $V_F$ of the SBD is lowered.

It is another object of the present invention to provide a semiconductor integrated circuit having an SBD, in which the degree-of-integration of the semiconductor integrated circuit can be enhanced by lowering the forward voltage of the SBD within a specified area.

According to one feature of the present invention, there is provided a semiconductor integrated circuit device comprising a semiconductor substrate, an impurity region of one conductivity type provided in said semiconductor substrate, a first common wiring layer connected to said impurity region preferably via a first high impurity concentration region of one conductivity type formed in said impurity region, a SBD provided on the surface of said impurity region, and second wiring layer connected to said SBD and extending along the the surface of an insulating film formed on said semiconductor substrate, characterized in that said SBD consists of at least two small SBD's connected in common with said second wiring layer or an electrode to which said second wiring layer being connected. Generally, the surface impurity concentration of said impurity region is $10^{17}$ atoms/cm$^3$, or less for forming SBD with metal or metal silicide.

According to another feature of the present invention, in the above-featured semiconductor integrated circuit device, the area of each said minor SBD is smaller than 200 μm$^2$.

The minor SBD, namely mutually divided SBD may be directly formed between the impurity region and the second wiring layer or the electrode such as aluminum. Moreover, the small SBD may be formed between the impurity region and a metallic layer such as a platinum silicide layer formed on a part of the impurity region, and the second wiring layer or the electrode is connected to the upper surface of the metallic layer.

According to still another feature of the present invention, in the first-featured semiconductor integrated circuit device, a second high impurity concentration region of one conductivity type having a higher impurity concentration than said impurity region is provided in the impurity region of one conductivity type between said small SBD's where no Schottky barrier is formed, and on an insulator film above said second high concentration region is provided a second wiring layer or an electrode for connecting the small SBD's in common.

The surface impurity concentration of said second region is favorably $10^{18}$ atoms/cm$^3$, or more. The width of said second region in the direction of the smaller SBD's is favorably 3 μm, or more, and the separating distance between the small SBD and the second high impurity concentration region ranges preferably from 4 μm to 15 μm. And, the distance between the small SBD's ranges favorably from 11 μm to 50 μm when the second high impurity concentration region exists. If the second high impurity concentration region does not be formed between the smaller SBD's, the distance between the smaller SBD's may range from 4 μm to 15 μm. The lower limits of these values are defined by the mask alignment or photo-resist technique and the upper limits are defined by the degree of the integration.

According to yet another feature of the present invention, there is provided a semiconductor integrated circuit device comprising a semiconductor substrate, an impurity region of one conductivity type provided in said semiconductor substrate and surrounded substantially with a isolating region of the opposite conductivity type, a plurality of SBD's formed in the surface of the impurity region of one conductivity type and arranged in one direction, a first high impurity concentration region of one conductivity formed in a part of the impurity region. A first wiring layer serves as a common electrode to the SBD's and is connected to the first high impurity concentration region in ohmic contact. A plurality of second wiring layers are electrically connected to respective ones of the SBD's. Each SBD consists of at least two smaller SBD's separated from each other by an insulating film formed on the surface of the impurity region and connected in common by the second wiring layer or an electrode. A plurality of second high impurity concentration regions of one conductivity type are provided in the impurity region of the first type between each pair of smaller SBD's and are separated from the smaller SBD's. A third high impurity concentration region of one conductivity type is provided in the impurity region between the SBD's each consisting of smaller SBD's, and is separated from each of the smaller SBD's.

The surface impurity concentration of the first, second and third high impurity concentration regions is $10^{18}$ atoms/cm$^3$ or more, and higher than that of the impurity region of the first conductivity type. These three regions may be continuously formed in the same manufacturing process.

BRIEF DESCRIPTION OF THE DRAWINGS

These and other features and objects of the present invention will become more apparent by reference to the following detailed description of its preferred embodiments taken in conjunction of the accompanying drawings, in which.

DETAILED DESCRIPTION OF THE INVENTION

Figure 1A:
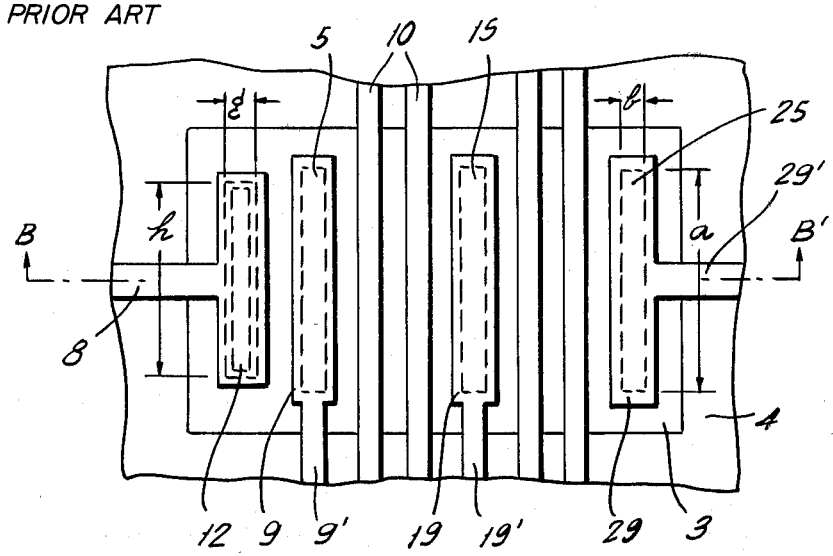
FIG. 1A is a plan view showing a semiconductor integrated circuit device having SBD's in the prior art.
Figure 1B:
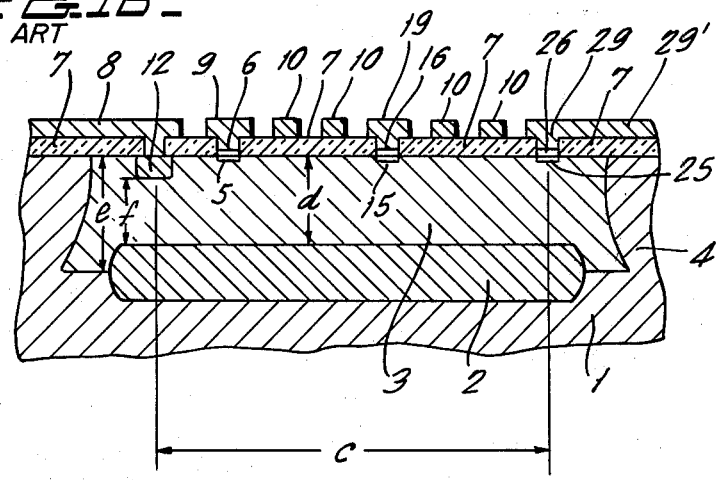
FIG. 1B is a cross-sectional view of the same device taken along line B–B' in FIG. 1A as viewed in the direction of the arrows.

Referring now to FIGS. 1A and 1B, which show one example of a semiconductor integrated circuit device having SBD's in the prior art, in a P-type semiconductor body 1 is provided a N$^+$-type buried layer 2 having a sheet resistivity of 20 $\Omega/\square$, and further an N-type epitaxial layer 3 having a thickness e of 5 $\mu$m and a specific resistance of 0.8 $\Omega$-cm and impurity concentration of $8 \times 10^{15}$ atoms/cm$^3$ is provided thereon and isolated by a P-type insulating separation region 4. A semiconductor substrate comprises the body 1 and the layer 3. On this epitaxial layer 3 are formed SBD's 5, 15 and 25, and electrodes 9, 19 and 29 formed on these SBD's serve in themselves as wiring layers 9', 19', 29' of these SBD's, and these wiring layers extend over an insulating film 7. The SBD's are formed between the surface of the epitaxial layer and platinum silicide layers 6, 16, 26 as metallic layers formed thereon, and the electrodes are contacted to the upper surface of the platinum silicide layers. The dimensions a and b of these SBD's are, for example 60 $\mu$m and 5 $\mu$m, respectively, and so, the area of the SBD is equal to 300 $\mu$m$^2$. In addition, a distance d from the surface of the epitaxial layer 3 to the buried layer 2 is 3.5 $\mu$m, and a distance f from an N$^+$-type first high impurity concentration region 12 having the sheet resistivity of 10 $\Omega/\square$ and the surface impurity concentration of $1.5 \times 10^{21}$ atoms/cm$^3$ to the buried layer 2 is 2.5 $\mu$m. The plan configuration of this N$^+$-type first high impurity concentration region 12 is such that its dimension g is 8 $\mu$m and the dimension h is 60 m, so that the area S' of the region 12 is equal to 480 $\mu$m$^2$, and further, to this N$^+$-type region 12 is connected a wiring layer 8 as a first common wiring layer which serves in common as one electrode of the plurality of SBD's 5, 15 and 25, and which extends along the insulating film 7 on the surface of the substrate 1. In such a semiconductor integrated circuit, necessarily there are provided other wiring layers 10 for connecting to the other elements (not shown) on the insulating films 7 between the SBD's, so that the distance c between the N$^+$-type first high impurity concentration region 12 and the SBD 25 is as long as 150 $\mu$m and thus the resistance therebetween is also high. This resistance between the region 12 and the SBD 25, in the given example, was measured and valve of 162 $\Omega$ was obtained. And, when the forward current $I_F$ was 3 mA, the forward voltage $V_F$ of 970 mV was measured at the SBD 25. This forward voltage value is considerably high, resulting in difference in properties from the SBD's 5 and 15.

Figure 2A:
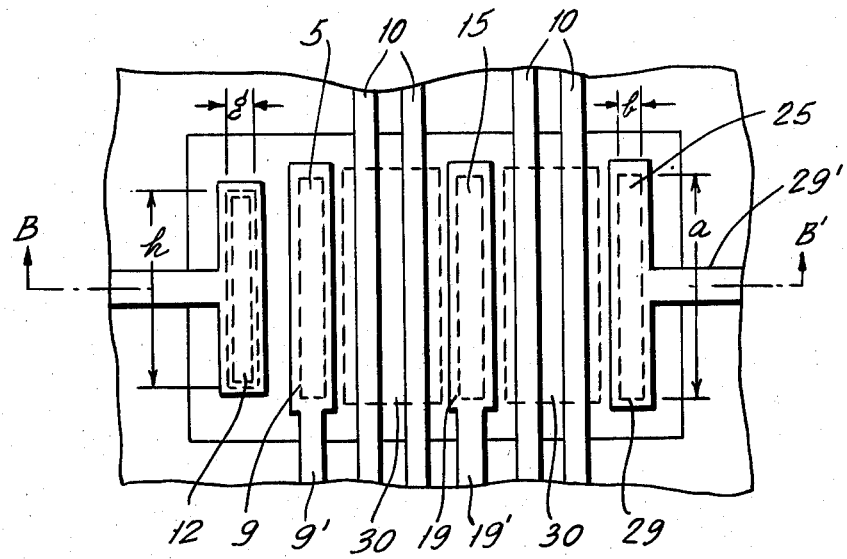
FIG. 2A is a plan view showing a semiconductor integrated circuit device having SBD's similar to that shown in FIG. 1A but modified in such manner that a high impurity concentration region is provided between the SBD's.
Figure 2B:
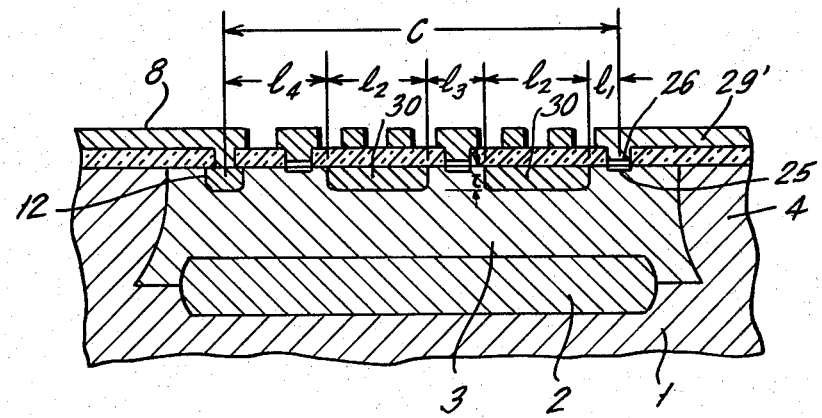
FIG. 2B is a cross-sectional view of the same device taken along line B–B' in FIG. 2A as viewed in the direction of the arrows.

On the other hand, for the purpose of reducing the forward voltage $V_F$ and also equalizing the forward voltages $V_F$ of the respective SBD's 5, 15 and 25 as much as possible, it has been contemplated to provide N$^+$-type high impurity concentration regions 30 having the depth i of 1 $\mu$m between the SBD's 5 and 15 and between the SBD's 15 and 25 as separated from the SBD's as shown in FIGS. 2A and 2B. The sheet resistivity of the regions 30 is 10 $\Omega/\square$, and the surface impurity concentration is $1.5 \times 10^{21}$ atoms/cm$^3$. In this modified case, the conditions for the respective parts equivalent to those shown in FIGS. 1A and 1B are the same as those described in connection to FIGS. 1A and 1B. In case where N$^+$-type high impurity concentration regions 30 having a lengthwise distance $l_2$ of 50 $\mu$m are provided, the respective dimensions $l_1$, $l_3$ and $l_4$ illustrated in FIGS. 2A and 2B are equal to 6 $\mu$m, 20 $\mu$m and 24 $\mu$m, respectively. In such a semiconductor integrated circuit, the resistance between the N$^+$-type first high impurity concentration region 12 connected to the electrode 8 common to the respective SBD's and the SBD 25 was measured and the value of 155 Ω was obtained. And when the forward current $I_p$ was 3 mA, the forward voltage $V_F$ of 948 mV was measured. This value is somewhat improved with respect to the device shown in FIGS. 1A and 1B, but it is not yet satisfactory.

Therefore, the inventor of the present invention tried to obtain the optimum range of the area S of the SBD's by investigating how the forward current $I_s$ and the resistance $r_d$ which determine the forward voltage $V_F$ are affected by the area S of the SBD.

The theory employed according to the present invention will be described first. Generally, a forward voltage $V_F$ of an SBD has been conceived according to the following equations:

$$V_F = (nKT/q) \cdot \ln(I_F/I_s) + r_d I_F \quad \text{(Equation 1)}$$

$$I_s = SAT^2 \exp(-q\phi_B/kT) \quad \text{(Equation 2)}$$

where the respective symbols represent the following items:

$V_F$: forward voltage of an SBD, $I_F$: forward current of an SBD, $I_s$: value of $I_F$ when $V_F=0$, n: ideal constant of an SBD, $r_c$: series resistance of an SBD, S: area of an SBD, $\phi_B$: a barrier height in an SBD, k: Boltzmann's constant, A: Richardson's constant, T: absolute temperature, and q: electric charge.

Figure 3A:
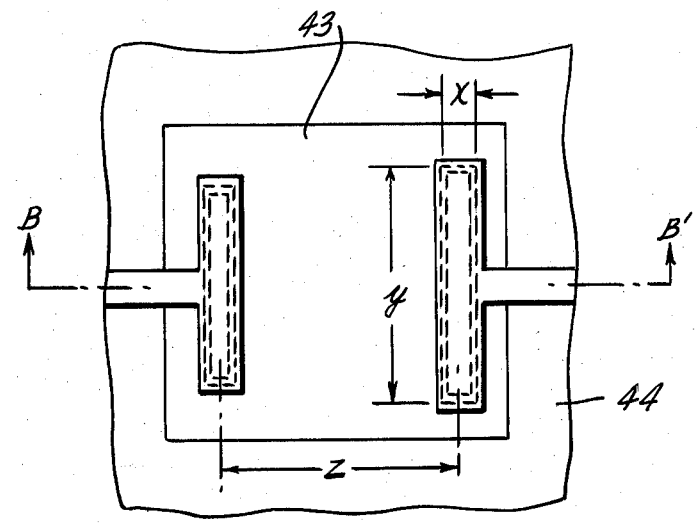
FIG. 3A is a plan view of a test element prepared for experimentally obtaining the relations of the area S of an SBD versus the value of forward current Is when a forward voltage $V_F=0$, and a series resistance $r_d$, respectively, of the same.
Figure 3B:
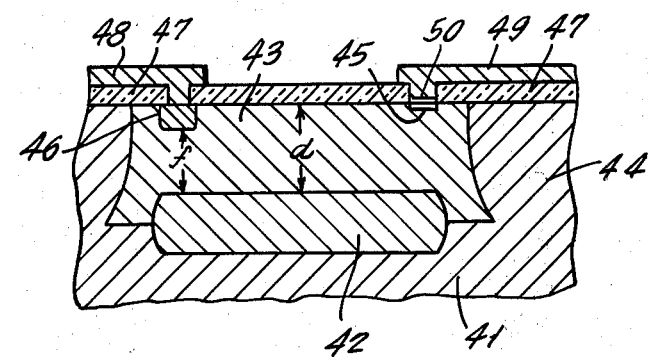
FIG. 3B is a cross-sectional view of the same element taken along line B–B' in FIG. 3A as viewed in the direction of the arrows.

From Equations (1) and (2) above, it will occur to one that in order to obtain an SBD having a low forward voltage $V_F$, the value of $I_s$ represented by Equation (2) should be made large. However, as to metals for forming an SBD that is stable in performance, of low cost and suitable for mass production, the varieties are limited and naturally the value of the height $\phi_B$ of barrier in an SBD is determined. Accordingly, there exists a fixed relation between the area S of an SBD and the forward curent $I_s$ on the basis of Equation (2). Therefore, test elements as shown in FIGS. 3A and 3B were prepared to investigate the influences of the area S upon the forward curent $I_s$ and the resistance $r_d$ respectively, while varying the area S of the SBD.

Tests were conducted while varying the dimension x of the SBD formed between the an epitaxial layer 43 and a metallic layer of platinum silicide layer 50 over 3~10 μm, and the dimension y over 10~1000 μm. The center distance z between the SBD 45 and the N+-type high concentration region 46 was 20 μm, and as a result, the data shown in FIGS. 4 and 5 were obtained. In this case, the test element was constructed in such manner that in a P-type semiconductor body 41 is provided a N+-type buried layer 42 having a sheet resistivity of 20 Ω/□, on which an N-type epitaxial layer 43 having a specific resistance of 0.8 Ω-cm and a thickness of 5 μm is provided. The epitaxial layer 43 is encircled by a P-type isolating separation region 44. A semiconductor substrate comprises the body 41, layer 42 and layer 43. In addition, there is provided an N+-type region 46 having an area of 480 μm² (=60 μm×8 μm) connected to a cathode electrode 48 of the SBD, which has a sheet resistivity of 10 Ω/□ and a depth of 1 μm. The dimensions d and f are 3.5 μm and 2.5 μm, respectively, and a wiring layer 49 was electrically connected to the SBD 45 and extended over a insulating film 47. It is to be noted that even if the impurity concentrations, layer thicknesses, the dimension z over 10~200 μm etc. in the test element are varied, the data shown in FIGS. 4 and 5 present the same tendency, and even if the plan configuration is varied, for example, into a circular shape, the tendency is still not varied.

Figure 4:
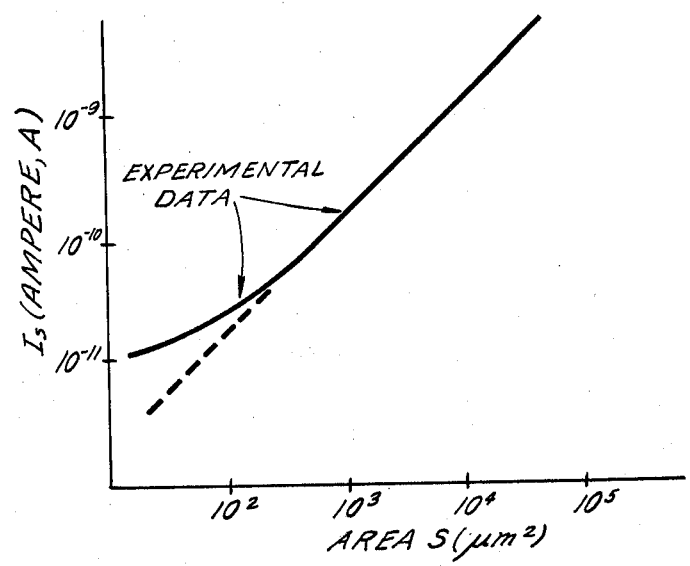
FIG. 4 is a diagram showing the relation of the area S of an SBD versus the forward current $I_s$ of the same when $V_F=0$ is satisfied, which was obtained experimentally by means of the test element shown in FIG. 3.

A characteristic curve representing the relation between an area of an SBD and a forward current $I_s$ of the same when $V_F=0$ is shown in the diagram in FIG. 4.

As shown in FIG. 4, in a region of relatively large areas S the value of $I_s$ coincides with Equation (2), but in a region of smaller areas S the $I_s$ takes a larger value than that of Equation (2). This implies that even if the area S of the SBD is successively reduced, the value of $I_s$ will not become so small. Also, from Equation (1) it is seen that in order to reduce the forward voltage $V_F$ of the SBD it is necessary to reduce the series resistance $r_d$ of the SBD. While the series resistance $r_d$ is determined by the impurity concentration in and thickness of the semiconductor layer, the distance between the cathode terminal and the SBD and the area of the SBD, even if the concentration of the semiconductor layer is enriched and its thickness is thinned for the purpose of reducting the series resistance of the SBD, they are limited in view of the breakdown voltage and the leakage current of the SBD, and the distance between the cathode terminal and the SBD is also to be a certain minimum length for convenience of wiring arrangement between circuit elements. To increase the area of the SBD is also not favorable because it results in increase of the parasitic capacitance of the element, enlargement of chip area and raise of the cost.

Figure 5:
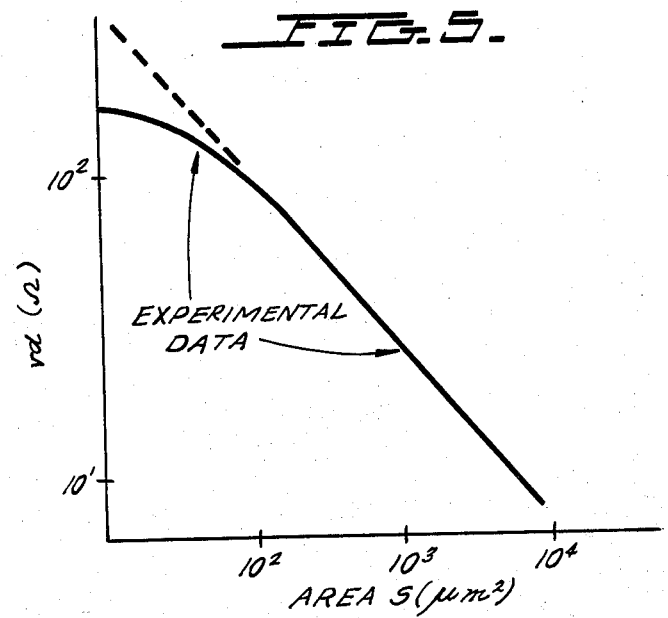
FIG. 5 is a diagram showing the relation of the area S of an SBD versus the series resistance $r_d$ of the same, which was obtained experimentally by means of the test element shown in FIG. 3.

A characteristic curve representing the relation between an area S of an SBD and a series resistance $r_d$ is shown in the diagram in FIG. 5.

As shown in FIG. 5, in the region of small areas S of the SBD, the inversely proportional relationship between the area S and the series resistance $r_d$ disappears, and even if the area S is reduced, the series resistance $r_d$ does not become as large as if the relationship were entirely linear.

As described above, the inventor of the present invention has recognized that in the region of small areas S of the SBD, the rate of variation of $I_s$ or $r_d$ with respect to the area S is small in comparison to the region of relatively large areas S.

The present invention contemplates utilizing the aforementioned phenomena to form an SBD having a low forward voltage within a semiconductor integrated circuit device without increasing the area of the SBD.

From the above-described data it is seen that the area of one SBD should be preferably smaller than 200 μm². More particularly, in cases where a large area SBD is necessitated, it is only necessary that the SBD is divided into two or more smaller SBD's and these smaller SBD's are connected with wiring layer or layers of the same metal as that forming the smaller SBD's, or a different metal extending on an insulator film, to be used jointly as a single SBD.

Figure 6C:
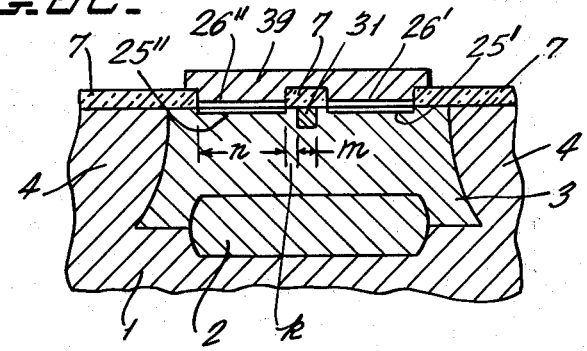
FIG. 6C is another cross-sectional view of the same embodiment taken along line C–C' in FIG. 6A as viewed in the direction of the arrows.
Figure 6A:
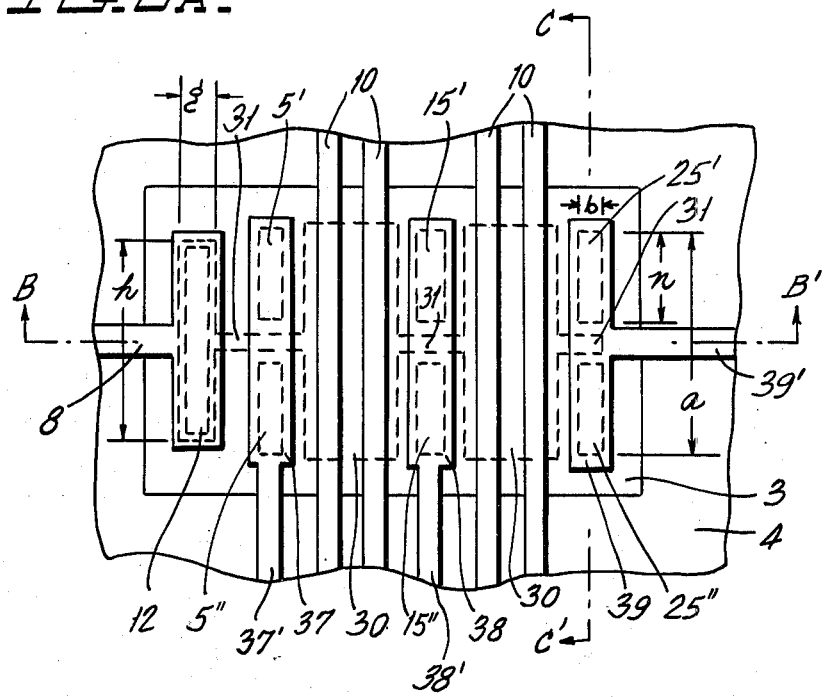
FIG. 6A is a plan view showing one preferred embodiment of the present invention.
Figure 6B:
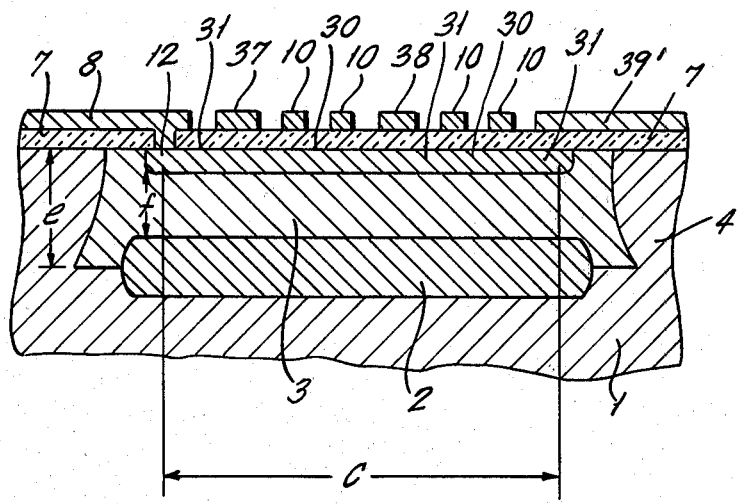
FIG. 6B is a cross-sectional view of the same embodiment taken along line B–B' in FIG. 6A as viewed in the direction of the arrows.

One preferred embodiment of the present invention is illustrated in FIGS. 6A, 6B and 6C, in which component parts identical to those of the device shown in FIGS. 1 and 2 are given like reference numerals. According to this preferred embodiment, the SBD's 5, 15 and 25 in FIGS. 1 and 2 are further divided into relatively small SBD's 5', and 5", relatively small SBD's 15' and 15" and relatively small SBD's 25' and 25", respectively, and also the platinum silicide layers 6, 16, and 26 are each divided, for example, 26', 26". Electrodes 37, 38 and 39 are formed over these small SBD's and connect a pair of these small SBD's and respectively serve in themselves as wiring layers 37', 38' and 39', respectively, to operate as a single SBD. Such division of an SBD into several relatively small SBD's has been derived from the experimental data illustrated in FIGS. 4 and 5. In the illustrated embodiment, the width b of the small SBD's is 5 μm similarly to the SBD in FIGS. 1 and 2, while the length n of the small SBD's is 21 μm. The relatively small SBD is formed between the surface of the epitaxial layer is 3 as an impurity region and a platinum silicide layer formed thereon. The electrode of aluminum is formed on the upper surface of the platinum silicide layer.

In addition, in the illustrated embodiment, N+-type second high impurity concentration regions 31 having the sheet resistivity of 10 Ω/□ are provided between the small SBD's in pairs for the purpose of improvement of the forward voltage $V_F$. The width m of these second regions 31 (see FIG. 6C) is 6 μm and the separating distance k between these regions 31 and the adjacent small SBD's is also 6 μm. The second high impurity concentration regions 31, the third high impurity concentration regions 30 which are the same regions as FIG. 2, and the first high impurity concentration region 12 are connected to a common wiring layer or common cathode electrode 8 and are continuously formed in the epitaxial layer 3.

In such a construction, a resistance between an electrode 8 and the SBD 25 consisting of the small SBD's 25' and 25" was measured, and the value of the resistance was about 100 Ω. This is about 40% lower than the resistance in the case of the device shown in FIG. 2, and it is caused by the effect of dividing to two relatively small SBD's and the by-pass effect of the N+-type second high concentration region 31. On the other hand, the area of a single small SBD is equal to $5 \times 22 = 110$ μm² and the forward current $I_S$ of one small SBD in this case is equal to $3.4 \times 10^{-11}$A, from FIG. 4.

Therefore, $I_S$ of two small SBD's is equal to $6.8 \times 10^{-11}$A. This value involves an increase of about 40% with respect to the devices shown in FIGS. 1 and 2 in which the area S of the SBD is equal to 300 μm² and the value of $I_S$ is equal to $5 \times 10^{-11}$A from FIG. 4. Note that the dimension a in FIG. 6 is equal to $2n + 2k + m$, and in the given example, the value of a is 60 μm which is the same value of a in FIGS. 1 and 2. Therefore, the integrated circuit of FIG. 6 has the same degree of integration as the integrated circuits of FIGS. 1 and 2. In the preferred embodiment, the forward voltage $V_F$ of the SBD 25 consisting of the minor SBD's 25' and 25" was measured by connecting the plus terminal of a voltage source to the second wiring layer 39' and the minus terminal to the first common wiring layer 8, respectively. When the forward current $I_F$ was 3 mA, the forward voltage $V_F$ was 775 mV. In this manner the $V_F$ of this preferred embodiment can be improved about 200 mV in comparison with the $V_F$ of the FIGS. 1 and 2. It is to be noted that if the forward voltage $V_F$ is to be improved to the same extent while maintaining the prior art structure, the area of the SBD must be about 1.7 times enlarged.

Figure 7:
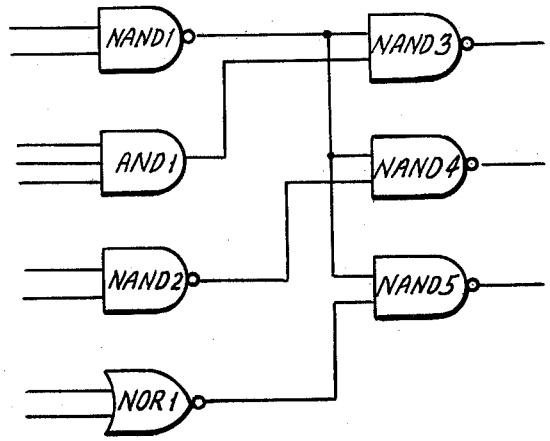
FIG. 7 is a block diagram of a logic circuit to which the present invention is applicable.

FIG. 7 is a block diagram of a semiconductor integrated circuit device having a DTL (Diode Transistor Logic) construction employing a plurality of SBD's. In this circuit device are provided front stage gates AND 1, NAND 2 and NOR 1 and rear stage gates NAND 3, NAND 4 and NAND 5 each of which receives one input signal from different one of the front stage gates. In addition, to the rear stage gates NAND 3, NAND 4 and NAND 5 is applied as the other input signal an output signal of an additional gate NAND 1. Thereby, when the output of the gate NAND 1 is set at a higher level, the transfer of data from the front stage gates to the rear stage gates is allowed, and by setting the output of the gate NAND 1 at a lower level the transfer of data is inhibited.

Figure 8:
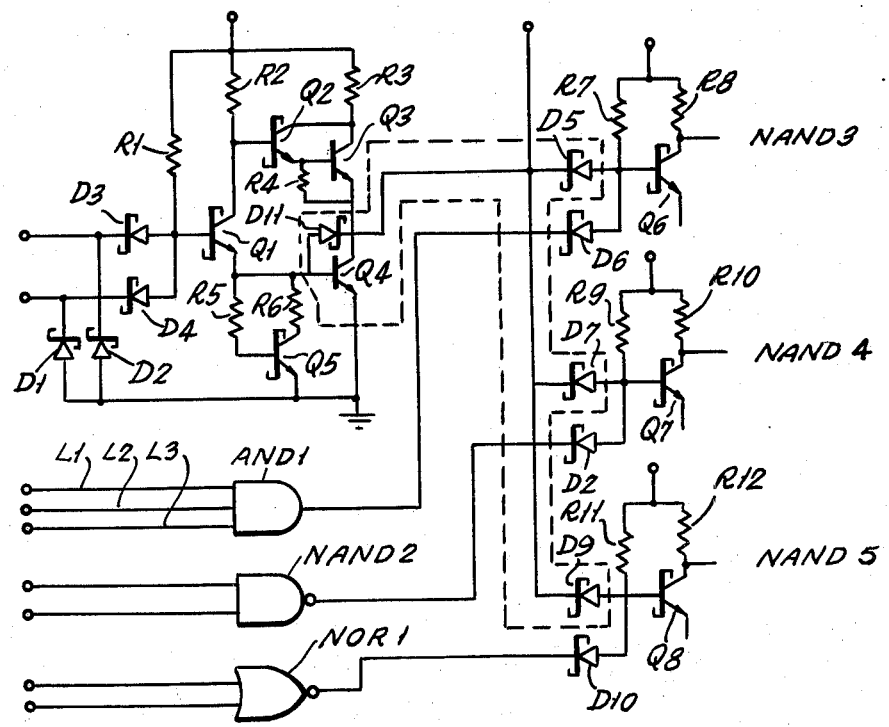
FIG. 8 is a more detailed representation of the logic circuit in FIG. 7 partly in a circuit diagram.

The same semiconductor integrated circuit device is shown in FIG. 8 with the part of the gates NAND1, NAND3, NAND4 and NAND5 represented in a more detailed circuit diagram form. This circuit is one example of a logic circuit in which the forwarded voltage $V_F$ of the SBD's is necessary to be lowered when the part encircled by a dash-line frame is formed in an integrated form on a semiconductor wafer.

In the operation of the circuit shown in FIG. 8, when a transistor $Q_4$ is turned ON and its collector takes a lower lever, the currents flowing through resistors $R_7$, $R_9$ and $R_{11}$ in the input circuits for the rear stage circuits connected to the collector of this transistor $Q_4$ will flow into the collector of the transistor $Q_4$ through SBD's $D_5$, $D_7$ and $D_9$, and thereby will bring the bases of the transistors $Q_6$, $Q_7$ and $Q_8$ to a lower level. Then, however, among these three base points at the point where the lower level is relatively high, sometimes the turn-OFF time of the transistor whose base is connected to that point will be retarded and if the lower level voltage at that point is extremely high, a malfunction will occur. As the cause for the rise of the lower level, it may occur to one that the forward voltages $V_F$ of the SBD's $D_5$, $D_7$, and $D_9$ become large, and that a collector-emitter saturation voltage $V_{CE}$ of the transistor $Q_4$ is high. More particularly, in case where the aforementioned three diodes are formed in one chip of semiconductor substrate, the series resistance $r_d$ intervening between the SBD $D_7$ or $D_9$, which are located remote from the common cathode, and said cathode will become large, and naturally the lower level voltage of the base of the transistor $Q_7$ or $Q_8$ will rise. Therefore, it is only necessary to form the part encircled by a dash-line frame in FIG. 8 as shown in FIG. 9 according to the present invention.

Figure 9A:
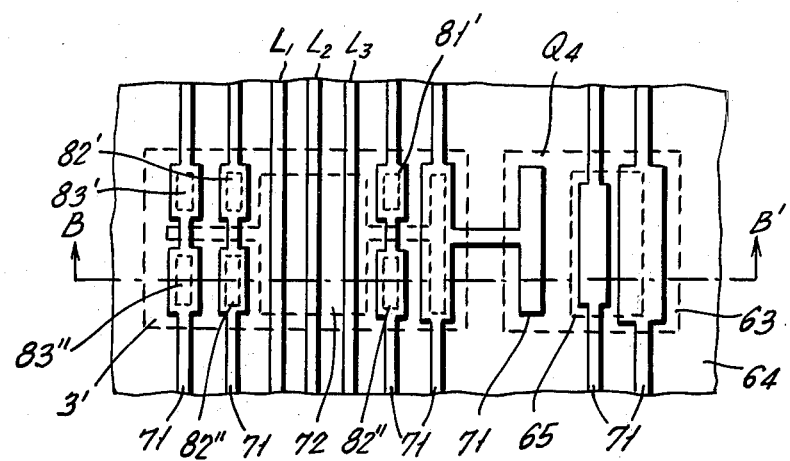
FIG. 9A is a plan view of a semiconductor integrated circuit device according to the present invention as applied to the part of the circuit in FIG. 8 encircled by a dash-line frame.
Figure 9B:
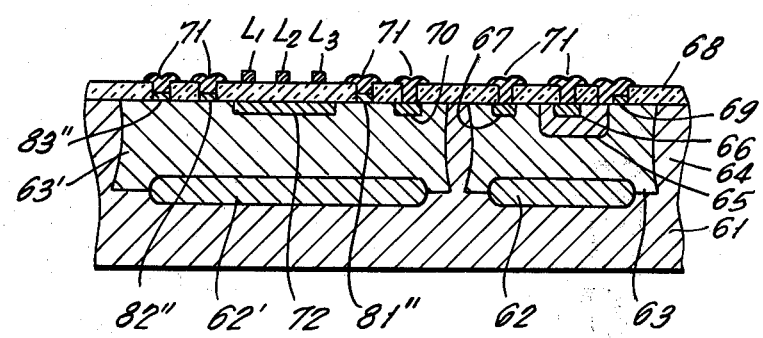
FIG. 9B is a cross-sectional view of the same device taken along ling B–B' in FIG. 9A as viewed in the direction of the arrows.

Referring now to FIG. 9, in a P-type semiconductor body 61 are formed N+-type buried layers 62 and 62' on which an N-type layer is provided and is isolated into two islands 63 and 63' by forming a P-type insulator separation layer 64. And, a semiconductor substrate comprises the body 61, layers 62, 62', 64 and the islands 63, 63'. In one island 63 are formed a P-type base region 65, an N+-type emitter region 66 and an N+-type collector contact region 67, and on the island 63 is coated an insulating film 68. The insulating film 68 is apertured and in one of the apertures a metallic layer 69 for forming the SBD $D_{11}$ of FIG. 8 is coated on the island 63. Then aluminum wiring 71 are provided so as to cover the apertures, and then there are formed a transistor $Q_4$ using the region 63 as its collector, the region 65 as its base and the region 66 as its emitter, and an SBD $D_{11}$ connected between the base and collector of the transistor $Q_4$. On the other hand, in the island 63' there are provided N+-type high concentration regions 70 and 72, and the region 70 located under one aperture in an insulating film 68 is used as a common cathode for the SBD's $D_5$, $D_7$ and $D_9$. In addition, in the remaining three apertures in the insulator film 68 are disposed metallic layers for forming relatively small SBD's and thereby the SBD $D_5$ consisting of the small SBD's 81' and 81", the SBD $D_7$ consisting of the minor SBD's 82' and 82", and the SBD $D_9$ consisting of the smaller SBD's 83' and 83" are formed. Aluminum layers 71 are then disposed to form wirings for the SBD's $D_5$, $D_7$ and $D_9$, and simultaneously wirings $L_1$, $L_2$ and $L_3$ to be used for a circuit arrangement are formed on the insulating film 68.

In the illustrated embodiment of the present invention, each SBD is divided into two smaller SBD's, and also in the region over which the wirings $L_1$, $L_2$ and $L_3$ extend is provided a region 72 of the same conductivity type (N-type) as the island 63' and having a higher impurity concentration than that of the island 63', which is further extended through the gap spaces between the smaller SBD's in pairs but not attached thereto. Thereby a current path can be formed, which extends from the anodes of the SBD's $D_5$, $D_7$ and $D_9$ into the low resistance region 72 and further extends from said region 72 to the cathode 70. Since the resistance value of the region 72 is extremely low, the series resistance $r_d$ from the anode to the cathode of the SBD becomes very low. In addition, according to the present invention, an elongated portion is provided in the region 72 and on the opposite sides of the elongated portion are disposed at least one pair of small SBD's which are connected to each other through a metallic wiring layer. Such construction has been adopted to increase the forward current $I_S$, when the forward voltage $V_F$ is zero volt, per unit area and to reduce the series resistance $r_d$ by making use of the facts that, as shown in FIGS. 4 and 5, even if the area of the SBD is reduced the forward current $I_S$ is not decreased proportionally and the series resistance $r_d$ is not increased in an inversely proportional manner.

For instance, in case where the specific resistance of the epitaxial layers 63 and 63' is 0.8 $\Omega$-cm, the sheet resistivity of the buried layers 62 and 62' is 20 $\Omega/\square$, the thickness of the epitaxial layers 63 and 63' is 5 $\mu$m, the thickness of the buried layer 62 and 62' in the epitaxial layers 63 and 63' is 1.5 $\mu$m, the sheet resistivity of the collector contact region 67, the cathode region and the N+-type high concentration region 72 is 10 $\Omega/\square$, the area of each of the smaller SBD's 83' and 83" is 150 $\mu$m$^2$, and the separation between the anode and cathode of the SBD $D_9$ is 130 $\mu$m, then in contrast to the series resistance of the SBD $D_9$ having the conventional structure of 130 $\Omega$, the series resistance of the device according to the present invention illustrated in FIG. 9 can be reduced to 90 $\Omega$ that is about 0.7 times the resistance value in the conventional structure.

While a P-type body is used in the above-described embodiments, it is a matter of course that the invention can be well practiced with an N-type body if all the conductivity types are reversed. In addition, while the high concentration region 72 is formed in the surface layer of the island 63' according to the above-described embodiment, a better result will be obtained if the region 72 is provided deeper until it reaches the buried layer 62'.

As described in detail above, according to the present invention, the forward voltage of a Schottky barrier diode can be lowered without increasing the area of the Schottky barrier diode.

I claim:

1. A semiconductor integrated circuit device, comprising:
   a semiconductor substrate having a surface and having an impurity region of one conductivity type adjacent said surface;
   a plurality of metallic layers formed of a first metallic material and located on said surface and spaced apart from each other so as to form a gap located over said impurity region, each of said metallic layers being at a respective position over said impurity region and having a predetermined contact surface area contacting said surface of said substrate and defining a respective Schottky barrier;
   first electrode electrically connected directly to said metallic layers and bridging the gap between said metallic layers above said impurity region, whereby said Schottky barriers formed between said metal layers and said substrate operate as a single Schottky diode;
   a first high impurity concentration region of said one conductivity type having a higher impurity concentration than said impurity region and located in said impurity region and adjacent said surface of said substrate; and
   electrode means in ohmic contact with said first high impurity concentration region; each of said contact surface areas being sufficiently small that it lies within a range of values in which it is related in a non-linear manner to at least one of: (1) the series resistance of the Schottky barrier of which it forms a part; and (2) the forward current at zero forward voltage of the Schottky barrier of which it forms a part such that the total forward drop of said Schottky diode defined by said separate Schottky barriers is less than the total drop of a Schottky diode formed of a single Schottky barrier having the same area as the total area of said Schottky barriers defining said Schottky diode.

2. The semiconductor integrated circuit of claim 1, in which said metallic layers and said first electrode means are made of the same material and continuously formed.

3. The semiconductor integrated circuit device of claim 1, further comprising a second high impurity concentration region of said one conductivity type having a higher impurity concentration than said impurity region and located in said impurity region between said Schottky barriers.

4. The semiconductor integrated circuit device of claim 1, in which each of said contact surface areas is equal to or smaller than 200 $\mu$m$^2$.

5. The semiconductor integrated circuit of claim 3, further comprising a third high impurity concentration region of said one conductivity type having a higher impurity concentration than said impurity region and located in said impurity region between said first and second high impurity concentration regions, said first, second and third high impurity concentration regions being continuous and integral.

6. A semiconductor integrated circuit comprising:
   a semiconductor substrate having a surface and having an impurity region of one conductivity type adjacent said surface;
   a plurality of Schottky barrier diodes located in said impurity region at said surface;
   a first high impurity concentrations region of said one conductivity type having a higher impurity concentration than said impurity region and located in part of said impurity region and adjacent said surface;
   a first wiring layer which is a common electrode to said Schottky barrier diodes and which is connected to said first high impurity concentration region;

a plurality of additional high impurity concentration regions of said one conductivity type having a higher impurity concentration than said impurity region and located in said impurity region between and spaced from each of said Schottky barrier diodes;

a plurality of second wiring layers each electrically connected to a respective one of said Schittky barrier diodes; each of said Schottky barrier diodes comprising at least two smaller Schottky barrier diodes that have the same barrier height, and that are separated from each other, the respective one of said second wiring layers being directly connected to said smaller Schottky barrier diodes so as to bridge the gap therebetween above said impurity region, said smaller Schottky barrier diodes having a total forward drop which is smaller than the total drop of a Schottky diode formed of a single Schottky barrier having the same area as the total area of said Schottky barrier defining said smaller Schottky diodes.

7. The semiconductor integrated circuit of claim 6, further comprising a plurality of second high impurity concentration regions of said one conductivity type having a higher impurity concentration than said impurity region, located in said impurity region between and spaced from each of said smaller Schottky barrier diodes that are included in each of said plurality of Schottky barrier diodes.

8. The semiconductor integrated circuit of claim 6, in which said area of each of said junctions is equal to or smaller than 200 $\mu m^2$.

9. The semiconductor integrated circuit of claim 7, in which said high impurity concentration regions are continuous and integral.

10. A semiconductor integrated circuit device, comprising:

a semiconductor substrate having a surface and having an impurity region of one conductivity type adjacent said surface;

a plurality of metallic layers formed of a first metallic material and located on said surface and spaced apart from each other, each of said metallic layers being at a respective position over said impurity region and having a predetermined contact surface area contacting said surface of said substrate and defining a respective Schottky barrier;

first electrode electrically connected directly to said metallic layers and bridging the gap between said metallic layers above said impurity region;

a first high impurity concentration region of said one conductivity type having a higher impurity concentration than said impurity region and located in said impurity region and adjacent said surface of said substrate; and second electrode means in ohmic contact with said first high impurity concentration region, said second electrode means defining a respective small Schottky barrier diode with each of said contact surface areas; each of said contact surface areas being less than about 200 square microns, whereby a single Schottky barrier diode consisting of said small Schottky barrier diodes defined by said Schottky barriers and said electrode means has a lower forward voltage than if said small Schottky barriers were continuous and integral with each other.

* * * * *